(12) United States Patent
Kim

(10) Patent No.: US 7,598,729 B2
(45) Date of Patent: Oct. 6, 2009

(54) SEMICONDUCTOR CHIP FLIPPING ASSEMBLY AND APPARATUS FOR BONDING SEMICONDUCTOR CHIP USING THE SAME

(75) Inventor: Sung Chul Kim, Seoul (KR)

(73) Assignee: Sigo Co., Ltd., Gwangju-si (KR)

( * ) Notice: Subject to any disclaimer, the term of this patent is extended or adjusted under 35 U.S.C. 154(b) by 300 days.

(21) Appl. No.: 11/764,855

(22) Filed: Jun. 19, 2007

(65) Prior Publication Data
US 2007/0296445 A1    Dec. 27, 2007

(30) Foreign Application Priority Data
Jun. 23, 2006    (KR) .................... 10-2006-0056814

(51) Int. Cl.
*H01L 21/67* (2006.01)
(52) U.S. Cl. .................................. 324/158.1
(58) Field of Classification Search ......... None
See application file for complete search history.

(56) References Cited

U.S. PATENT DOCUMENTS

| 3,793,714 A * | 2/1974 | Bylander ..................... 29/827 |
| 6,311,391 B1 * | 11/2001 | Fuke et al. ................... 29/740 |
| 6,872,596 B2 * | 3/2005 | Waeckerle .................. 438/113 |

\* cited by examiner

*Primary Examiner*—Paresh Patel
(74) *Attorney, Agent, or Firm*—Sughrue Mion, PLLC

(57) ABSTRACT

A semiconductor chip flipping assembly and an apparatus for bonding a semiconductor chip using the same are disclosed. In accordance with the semiconductor chip flipping assembly and the apparatus for bonding a semiconductor chip using the same, a front surface of a wafer is mounted in a wafer holder to face downward. Each of dies of the wafer is then pushed downward to a tray disposed therebelow, thereby eliminating a need for a separate flipping process of the semiconductor chip and two or more robot arms.

17 Claims, 3 Drawing Sheets

SEMICONDUCTOR CHIP FLIPPING ASSEMBLY AND APPARATUS FOR BONDING SEMICONDUCTOR CHIP USING THE SAME

BACKGROUND OF THE INVENTION

1. Field of the Invention

The present invention relates to a semiconductor chip flipping assembly and an apparatus for bonding a semiconductor chip using the same, and in particular to a semiconductor chip flipping assembly and an apparatus for bonding a semiconductor chip using the same wherein a separate flipping process is not required since a front surface of a wafer is mounted to face downward and a die is then pushed downward to a tray therebelow.

2. Description of the Related Art

A plurality of semiconductor chips are formed on a wafer. Each of the plurality of semiconductor chips includes a connection pad for connecting to an external terminal. Generally, an integrated circuit (IC) has a structure wherein a plurality of wires are bonded to the pad to be contacted to a lead outside a packaging thereof.

On the other hand, a flip chip includes a bump for a connection to an external connector. The flip chip is flipped in a manner that a surface having the bump faces downward and then press-bonded or heat-bonded to a bonding terminal of an object to be bonded such as a flexible film.

A conventional flip chip bonding method is described below in detail.

FIG. 1 is a flow diagram depicting a conventional flip chip bonding method.

Referring to FIG. 1, a semiconductor wafer is sawed to be divided into a plurality of semiconductor chips and mounted in a wafer holder. A first robot arm having a vacuum suction picks up one of the plurality of semiconductor chips. The picked-up semiconductor chip is flipped by a rotation of the first robot arm. A lower surface of each of the flipped semiconductor chips wherein electrical elements are not formed, i.e. a back surface thereof faces upward. The flipped semiconductor chips are sequentially picked up by a second robot arm to be disposed on and aligned to an object to be bonded. A front surface of the disposed semiconductor chip faces downward, and a bump formed on the semiconductor chip and a connection area of the object to be bonded are in contact. The disposed semiconductor chip is heated and pressed for bonding.

In accordance with the conventional flip chip bonding method, two processes including a flipping process and a pick & place process of the flipped chip are required. That is, the flipping process wherein the semiconductor chip is picked from the wafer and flipped by the first robot arm and the pick & place process wherein the flipped chip is picked up by the second robot arm to be disposed on the object to be bonded.

Since the two processes are carried out by the robot arms, a time taken while moving of the robot arm is relatively long. In addition, a cost for installing the two robot arms is high, and a complexity of a bonding apparatus is increased. Particularly, a production per hour is decreased as the time taken while moving of the robot arm is increased. That is, a productivity is decreased due to the robot arm. The productivity is an index for measuring a competitiveness of a manufacturing company as well as having a great effect on a manufacturing cost of a product, which is a most important factor of a survival of the manufacturing company.

Therefore, various methods for increasing the productivity are proposed. However, due to a characteristic of the flip chip wherein the semiconductor chip should be flipped, a method that overcomes the above-described problem is not available.

SUMMARY OF THE INVENTION

It is an object of the present invention to provide a semiconductor chip flipping assembly and an apparatus for bonding a semiconductor chip using the same wherein a separate flipping process is not required since a front surface of a wafer is mounted to face downward and a die is then pushed downward to a tray therebelow.

In order to achieve above-described object of the present invention, there is provided a semiconductor chip bonding apparatus comprising: an object feeding module for providing an object to be bonded; a semiconductor chip flipping assembly for sequentially disposing each of a plurality of semiconductor chips of a wafer on a tray disposed therebelow; and a press module for applying a pressure to each of the plurality of semiconductor chips disposed on the object so as to electrically bond each of the plurality of semiconductor chips to the object; wherein the semiconductor chip flipping assembly comprises: a wafer holder for mounting the wafer in a manner that a front surface of the wafer faces downward; a pusher for pushing each of the plurality of semiconductor chips of the mounted wafer downward to be disposed on the tray; a tray conveying module for moving the tray; and a pickup module for sequentially picking up each of the plurality of semiconductor chips disposed in the tray and disposing the picked up semiconductor chip on the object to be bonded provided by the object feeding module.

Preferably, the semiconductor chip bonding apparatus further comprises a test module for testing each of the plurality of semiconductor chips electrically bonded to the object.

Preferably, the object feeding module comprises: a magazine loading module for loading the object to be bonded; and an object conveying module for sequentially conveying the object to be bonded to the semiconductor chip flipping assembly.

Preferably, the semiconductor chip flipping assembly further comprises a pusher conveying means for conveying the pusher to a predetermined position.

Preferably, the pusher conveying means comprises: a pusher holder having the pusher mounted therein; a horizontal conveying means having the pusher holder mounted therein, the horizontal conveying means conveying the pusher holder in a horizontal direction; a wafer aligning assembly having the horizontal conveying means mounted therein; and a vertical conveying means having the wafer aligning assembly mounted therein, the vertical conveying means conveying the wafer aligning assembly in a vertical direction.

Preferably, the tray conveying module conveys the tray by a predetermined distance according to an arrangement gap of the object to be bonded to adjust a distance between the plurality of semiconductor chips disposed in the tray.

Preferably, the semiconductor chip flipping assembly further comprises a tray vacuum suction module disposed below the tray, the tray vacuum suction module sucking in the semiconductor chip pushed downward to dispose the semiconductor chip in a chip guide of the tray.

Preferably, the pick module comprises: a vacuum suction module for picking up each of the plurality of semiconductor chips disposed in the tray by a vacuum suction; an up/down conveying means having the vacuum suction module mounted therein, the conveying means conveying the vacuum suction module upward and downward; and a vertical conveying means for conveying the up/down conveying means in a vertical direction.

Preferably, the press module comprises: a pressure bonding means for press-bonding each of the plurality of semiconductor chips to the object to be bonded; and a heat bonding means for heat-bonding each of the plurality of semiconductor chips to the object to be bonded.

Preferably, the object to be bonded comprises an antennal of an RFID tag.

There is also provided a semiconductor chip flipping assembly comprising: a wafer holder for holding a wafer in a manner that a front surface of the wafer faces downward; a pusher for sequentially pushing each of plurality of semiconductor chips of the mounted wafer downward; a tray disposed under the wafer, the tray including a semiconductor chip guide for disposing the plurality of semiconductor chips pushed by the pusher therein; and a pickup module for sequentially picking up each of the plurality of semiconductor chips disposed in the tray and disposing the picked up semiconductor chip on an object to be bonded.

Preferably, the semiconductor chip bonding apparatus further comprises a pusher conveying means for conveying the pusher to a predetermined position.

Preferably, the pusher conveying means comprise: a pusher holder having the pusher mounted therein; a horizontal conveying means having the pusher holder mounted therein, the horizontal conveying means conveying the pusher holder in a horizontal direction; a wafer aligning assembly having the horizontal conveying means mounted therein; and a vertical conveying means having the wafer aligning assembly mounted therein, the vertical conveying means conveying the wafer aligning assembly in a vertical direction.

Preferably, the semiconductor chip bonding apparatus further comprises a tray conveying module for moving the tray in a horizontal direction.

Preferably, the tray conveying module conveys the tray by a predetermined distance according to an arrangement gap of the object to be bonded to adjust a distance between the plurality of semiconductor chips disposed in the tray.

the semiconductor chip bonding apparatus further comprises a tray vacuum suction module disposed below the tray, the tray vacuum suction module sucking in the semiconductor chip pushed downward to dispose the semiconductor chip in the chip guide of the tray.

Preferably, the pick module comprises: a vacuum suction module for picking up each of the plurality of semiconductor chips disposed in the tray by a vacuum suction; an up/down conveying means having the vacuum suction module mounted therein, the conveying means conveying the vacuum suction module upward and downward; and a vertical conveying means for conveying the up/down conveying means in a vertical direction.

DETAILED DESCRIPTION OF THE INVENTION

The present invention will now be described in detail with reference to the accompanied drawings. The interpretations of the terms and wordings used in Description and Claims should not be limited to common or literal meanings. The embodiments of the present invention are provided to describe the present invention more thoroughly for those skilled in the art.

Figure 1:
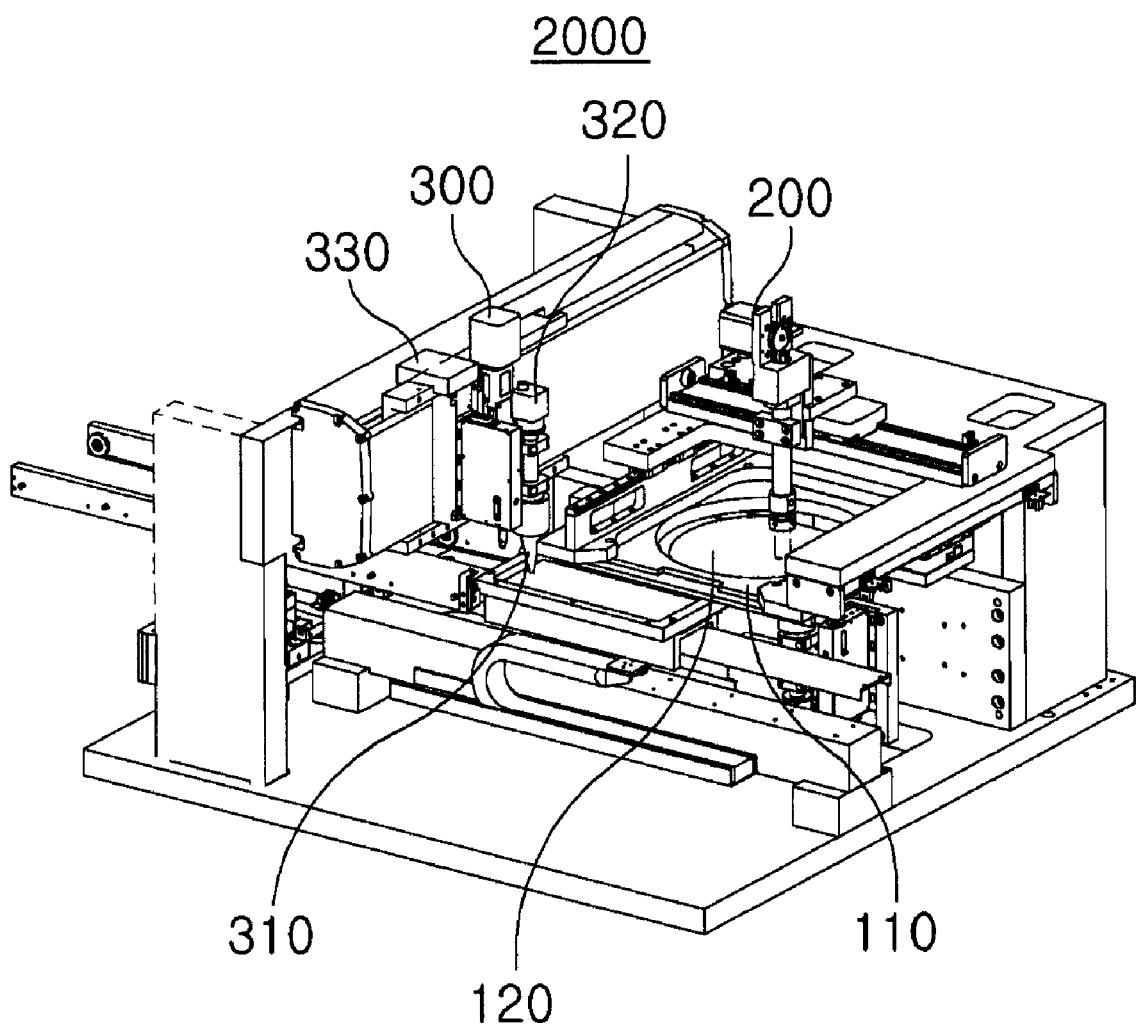
FIG. 1 is a perspective view depicting a semiconductor chip flipping assembly in accordance with the present invention.
Figure 2:
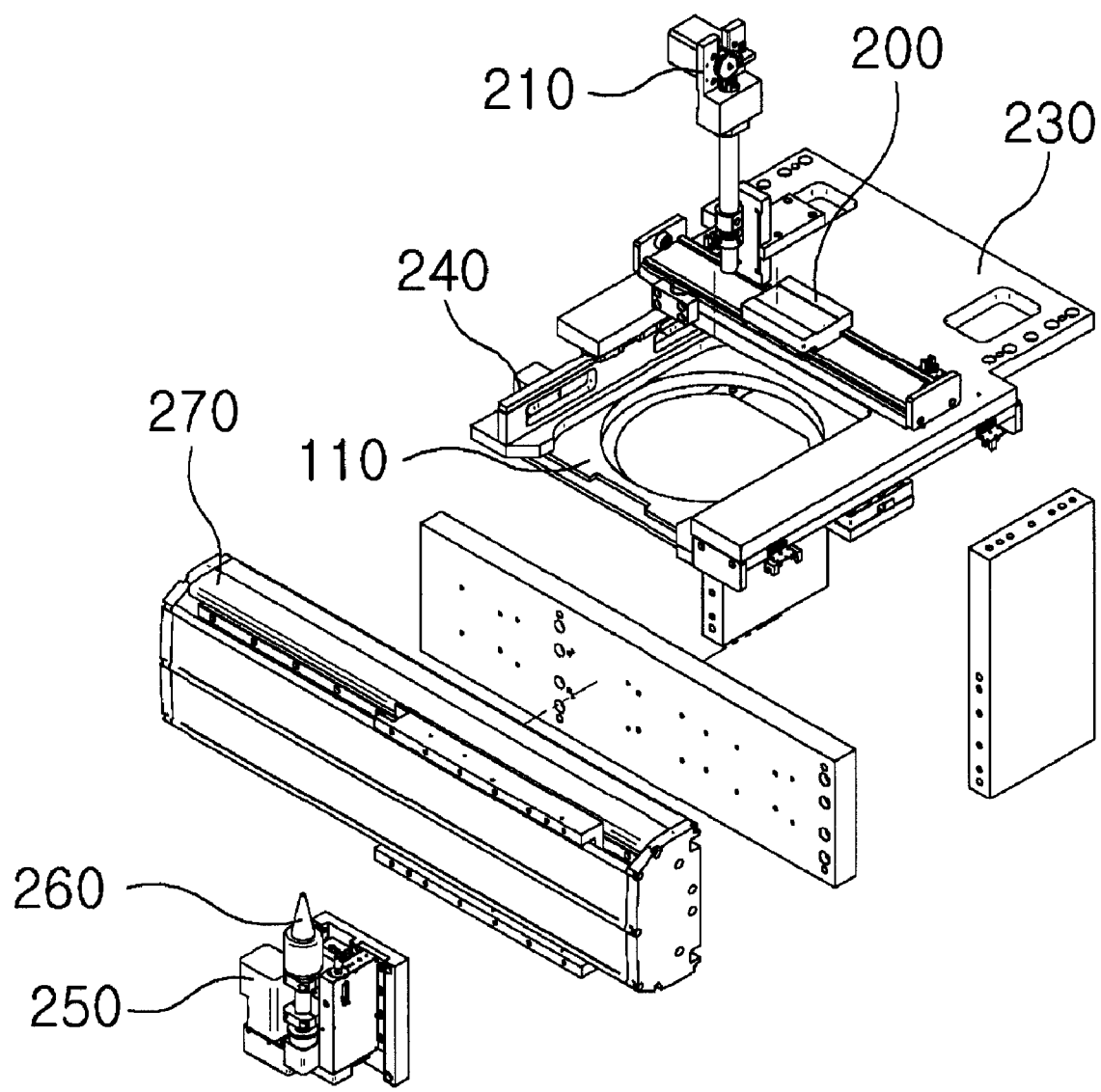
FIG. 2 is a disassembled view depicting a semiconductor chip flipping assembly in accordance with the present invention.

FIGS. 1 and 2 are a perspective view and a disassembled view depicting a semiconductor chip flipping assembly in accordance with the present invention, respectively.

Referring to FIGS. 1 and 2, the semiconductor chip flipping assembly 2000 in accordance with the present invention comprises a wafer holder 110, a pusher 200, a tray 120 and a pickup module 300. The semiconductor chip flipping assembly 2000 may further comprise a tray vacuum suction module 250.

The wafer holder 110 holds a wafer including a plurality of semiconductor chips. The wafer is held in a manner that a front surface of the wafer faces downward.

The pusher 200 sequentially pushes each of the plurality of semiconductor chips of the mounted wafer downward. A pusher conveying means conveys the pusher 200 to a predetermined position in order to push each of the plurality of semiconductor chips downward since the plurality of semiconductor chips, i.e. dies are formed in the wafer.

The pusher conveying means comprise a pusher holder 210 having the pusher 200 mounted therein, a horizontal conveying means 220 having the pusher holder 210 mounted therein wherein the horizontal conveying means 220 conveys the pusher holder 210 in a horizontal direction (i.e., a direction of x-axis), a wafer aligning assembly 230 having the horizontal conveying means 220 mounted therein and a vertical conveying means 240 having the wafer aligning assembly 230 mounted therein wherein the vertical conveying means 240 conveys the wafer aligning assembly 230 in a vertical direction (i.e., a direction of y-axis).

The pusher 200 is freely movable by the pusher conveying means in the direction of x-axis and the direction of y-axis, and the pusher 200 is moved to the predetermined position to push down the semiconductor chip thereunder.

The tray 120 is disposed under the wafer, and includes a plurality of semiconductor chip guides for accommodating therein the plurality of semiconductor chips pushed down by the pusher 200.

The plurality of semiconductor chip guides of the tray 120 for accommodating therein the plurality of semiconductor chips are arranged to have a predetermined distance therebetween.

The tray 120 is conveyed by a tray conveying module (not shown) wherein the tray conveying module moves the tray 120 according to a position of the semiconductor chip in the wafer pushed down by the pusher 200 such that the pushed semiconductor chip is disposed in an appropriate semiconductor chip guide of the plurality of semiconductor chip guides.

In particular, the tray conveying module moves the tray 120 by a predetermined distance according to an arrangement gap of an object to be bonded (an antenna of an RFID tag, for instance) to adjust a distance between the plurality of semiconductor chips disposed in the tray 120. For instance, when the object is sequentially fed from a roll including the plurality of objects, a number of the objects included per unit length differs according to a size of the object. In such case, when the distance between the semiconductor chips accommodated in the tray is adjusted, the semiconductor chip may be bonded to the object to be bonded without reprogramming the pickup module 300. In one embodiment, when objects having a standard size are successively provided, the semiconductor chips are disposed in an entirety of the plurality of semiconductor chip guides, and when objects having a size twice larger than the standard size are successively provided, the semiconductor chips are disposed in every two of the plurality of semiconductor chip guides.

The pickup module 300 sequentially picks up each of the plurality of semiconductor chips disposed in the tray 120 to be placed on the object to be bonded.

The pick module 300 comprises a vacuum suction module 310 for picking up each of the plurality of semiconductor chips disposed in the tray 120 by a vacuum suction, an up/down conveying means 320 having the vacuum suction module 310 mounted therein wherein the up/down conveying means 320 conveys the vacuum suction module 310 upward and downward (i.e. in a direction of z-axis), and a vertical conveying means 330 for conveying the up/down conveying means 320 in the vertical direction (i.e. the direction of y-axis).

The tray vacuum suction module 250 is disposed below the tray 120 and the tray vacuum suction module 250 sucks in the semiconductor chip pushed downward to dispose the semiconductor chip in the semiconductor chip guide of the tray 120. The tray vacuum suction module 250 enables an accurate placement of the pushed-down semiconductor chip in the semiconductor chip guide. It is preferable that the tray vacuum suction module 250 comprises a conveying means 270 for moving a vacuum suction apparatus 260.

Figure 3:
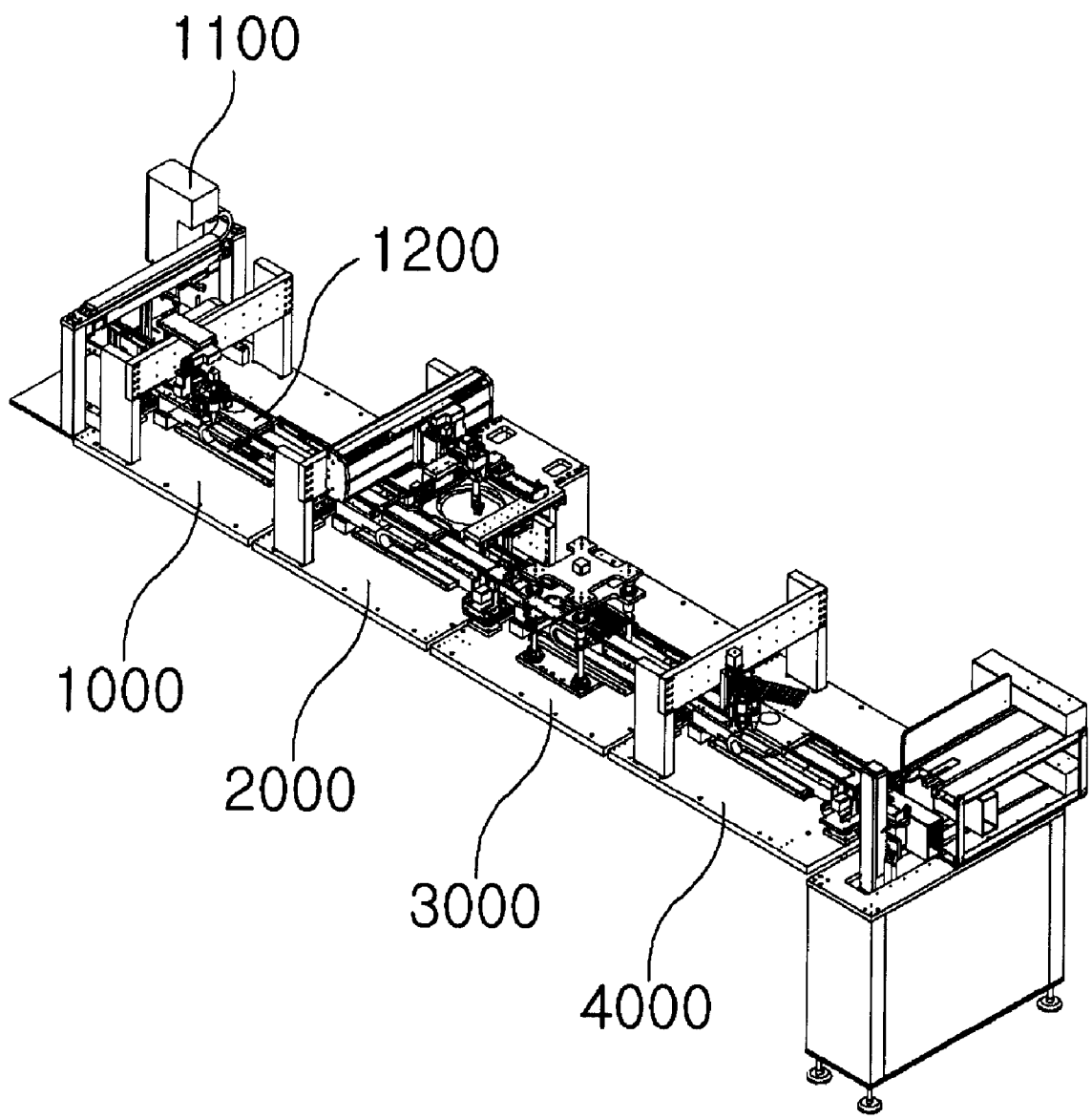
FIG. 3 is a perspective view depicting an apparatus for bonding semiconductor chip using a semiconductor chip flipping assembly in accordance with the present invention.

FIG. 3 is a perspective view depicting an apparatus for bonding semiconductor chip using a semiconductor chip flipping assembly in accordance with the present invention.

Referring to FIG. 3, the apparatus for bonding semiconductor chip using the semiconductor chip flipping assembly in accordance with the present invention comprises an object feeding module 1000, the semiconductor chip flipping assembly 2000 and a press module 3000. The apparatus for bonding semiconductor chip may further comprise a test module 4000.

The object feeding module 1000 provides an object (not shown) to be bonded to a semiconductor chip.

The object feeding module 1000 may comprise a magazine loading module 1100 for loading the object to be bonded, and an object conveying module 1200 for sequentially conveying the object to be bonded to the semiconductor chip flipping assembly 2000.

The object to be bonded may be provided in a form of a magazine. In such case, each object is provided to the semiconductor chip flipping assembly 2000 by the object conveying module 1200.

The semiconductor chip flipping assembly 2000 comprises the wafer holder for holding the wafer in a manner that the front surface of the wafer faces downward, the pusher for pushing each of the plurality of semiconductor chips of the mounted wafer downward to be disposed on the tray, the tray conveying module for moving the tray and the pickup module for sequentially picking up each of the plurality of semiconductor chips disposed in the tray and disposing the picked up semiconductor chip on the object to be bonded provided by the object feeding module 1000.

The semiconductor chip is disposed on and aligned to the object to be bonded by the semiconductor chip flipping assembly 2000. While the semiconductor chip flipping assembly 2000 is described with reference to FIGS. 1 and 2, a detailed description thereof is omitted.

The press module 3000 presses each of the plurality of semiconductor chips disposed on the object for a bonding. When the semiconductor chip which is disposed on and aligned to the object is conveyed to the press module 3000 by the semiconductor chip flipping assembly 2000, the press module 3000 presses the semiconductor chip to the object so as to electrically bond each of the plurality of semiconductor chips to the object.

Preferably, the press module 3000 comprises a pressure bonding means (not shown) for press-bonding each of the plurality of semiconductor chips to the object to be bonded and a heat bonding means for heat-bonding each of the plurality of semiconductor chips to the object to be bonded. The semiconductor chip is thereby fixedly attached to the object to be bonded.

The apparatus for bonding the semiconductor chip using the semiconductor chip flipping assembly in accordance with the present invention may further comprise the test module 4000. When the semiconductor chip and the object which are bonded together are conveyed to the test module 4000 by a conveying means (not shown), the test module 4000 carries out a test by applying a predetermined signal to determine whether the bonding is carried out properly and the semiconductor chip operates correctly.

A method for operating the apparatus for bonding the semiconductor chip using the semiconductor chip flipping assembly in accordance with the present invention is be described below in detail.

A wafer having a plurality of semiconductor chips disposed on a front surface thereof is prepared. The wafer includes the plurality of semiconductor chips diced along a scribe lane on the wafer by a semiconductor chip unit. A surface on which the plurality of semiconductor chips are formed is referred to as a front surface and a surface opposite to the front surface is referred to as a back surface hereinafter.

Thereafter, the wafer is disposed on a wafer holder in a manner that the front surface of the wafer faces downward. The disposition of the wafer may be carried out automatically or manually.

Thereafter, each of the plurality of semiconductor chips is pushed downward by a pusher (not shown) to be disposed on a tray. The tray may be conveyed in a predetermined direction for a pick & place when the disposition of the plurality of semiconductor chips is complete. The tray may be moved in order to adjust a distance between the plurality of semiconductor chips disposed in the tray. For instance, when the object is an antenna of an RFID tag fed through a magazine or a roll, the distance between the plurality of semiconductor chips disposed in the tray may be adjusted. Through such adjustment, the semiconductor may correspond to the object to be bonded by a ratio of 1:1. Preferably, the semiconductor chip pushed downward is guided to the tray by a vacuum suction in order to dispose the semiconductor chip in a desired semiconductor chip guide.

The semiconductor chips disposed in the tray are already flipped, that is, a surface of the semiconductor chip having a contact pad is facing downward.

Thereafter, the tray is conveyed to a proper position for the pick & place. The plurality of semiconductor chips are sequentially picked up by a robot arm (not shown) to be disposed on and aligned to the object to be bonded.

Thereafter, the semiconductor chip is bonded to the object to be bonded using the press module. The bonding process may comprise a pressure-bonding each of the plurality of semiconductor chips to the object to be bonded and heat-bonding each of the plurality of semiconductor chips to the object to be bonded.

When the bonding process is complete, a test is carried out by applying a predetermined signal to determine whether the bonding process is carried out properly and the semiconductor chip operates correctly.

As described above, in accordance with the semiconductor chip flipping assembly and the apparatus for bonding the semiconductor chip using the same, the separate flipping process is not required since the front surface of the wafer is mounted to face downward and the die is then pushed downward to the tray therebelow. Moreover, since the flip chip bonding process may be carried out using a single vacuum suction, a productivity is maximized and the manufacturing cost of the bonding apparatus is reduced.

What is claimed is:

1. A semiconductor chip bonding apparatus comprising:
    an object feeding module for providing an object to be bonded;
    a semiconductor chip flipping assembly for sequentially disposing each of a plurality of semiconductor chips of a wafer on a tray disposed therebelow; and
    a press module for applying a pressure to each of the plurality of semiconductor chips disposed on the object so as to electrically bond each of the plurality of semiconductor chips to the object;
wherein the semiconductor chip flipping assembly comprises:
- a wafer holder for mounting the wafer in a manner that a front surface of the wafer faces downward;
- a pusher for pushing each of the plurality of semiconductor chips of the mounted wafer downward to be disposed on the tray;
- a tray conveying module for moving the tray; and
- a pickup module for sequentially picking up each of the plurality of semiconductor chips disposed in the tray and disposing the picked up semiconductor chip on the object to be bonded provided by the object feeding module.

2. The apparatus in accordance with claim 1, further comprising a test module for testing each of the plurality of semiconductor chips electrically bonded to the object.

3. The apparatus in accordance with claim 1, wherein the object feeding module comprises:
- a magazine loading module for loading the object to be bonded; and
- an object conveying module for sequentially conveying the object to be bonded to the semiconductor chip flipping assembly.

4. The apparatus in accordance with claim 1, wherein the semiconductor chip flipping assembly further comprises a pusher conveying means for conveying the pusher to a predetermined position.

5. The apparatus in accordance with claim 4, wherein the pusher conveying means comprises:
- a pusher holder having the pusher mounted therein;
- a horizontal conveying means having the pusher holder mounted therein, the horizontal conveying means conveying the pusher holder in a horizontal direction;
- a wafer aligning assembly having the horizontal conveying means mounted therein; and
- a vertical conveying means having the wafer aligning assembly mounted therein, the vertical conveying means conveying the wafer aligning assembly in a vertical direction.

6. The apparatus in accordance with claim 1, wherein the tray conveying module conveys the tray by a predetermined distance according to an arrangement gap of the object to be bonded to adjust a distance between the plurality of semiconductor chips disposed in the tray.

7. The apparatus in accordance with claim 1, wherein the semiconductor chip flipping assembly further comprises a tray vacuum suction module disposed below the tray, the tray vacuum suction module sucking in the semiconductor chip pushed downward to dispose the semiconductor chip in a chip guide of the tray.

8. The apparatus in accordance with claim 1, wherein the pick module comprises:
- a vacuum suction module for picking up each of the plurality of semiconductor chips disposed in the tray by a vacuum suction;
- an up/down conveying means having the vacuum suction module mounted therein, the conveying means conveying the vacuum suction module upward and downward; and
- a vertical conveying means for conveying the up/down conveying means in a vertical direction.

9. The apparatus in accordance with claim 1, wherein the press module comprises:
- a pressure bonding means for press-bonding each of the plurality of semiconductor chips to the object to be bonded; and
- a heat bonding means for heat-bonding each of the plurality of semiconductor chips to the object to be bonded.

10. The apparatus in accordance with claim 1, wherein the object to be bonded comprises an antennal of an RFID tag.

11. A semiconductor chip flipping assembly comprising:
- a wafer holder for holding a wafer in a manner that a front surface of the wafer faces downward;
- a pusher for sequentially pushing each of plurality of semiconductor chips of the mounted wafer downward;
- a tray disposed under the wafer, the tray including a semiconductor chip guide for disposing the plurality of semiconductor chips pushed by the pusher therein; and
- a pickup module for sequentially picking up each of the plurality of semiconductor chips disposed in the tray and disposing the picked up semiconductor chip on an object to be bonded.

12. The assembly in accordance with claim 11, further comprising a pusher conveying means for conveying the pusher to a predetermined position.

13. The assembly in accordance with claim 12, wherein the pusher conveying means comprise:
- a pusher holder having the pusher mounted therein;
- a horizontal conveying means having the pusher holder mounted therein, the horizontal conveying means conveying the pusher holder in a horizontal direction;
- a wafer aligning assembly having the horizontal conveying means mounted therein; and
- a vertical conveying means having the wafer aligning assembly mounted therein, the vertical conveying means conveying the wafer aligning assembly in a vertical direction.

14. The assembly in accordance with claim 11, further comprising a tray conveying module for moving the tray in a horizontal direction.

15. The assembly in accordance with claim 14, wherein the tray conveying module conveys the tray by a predetermined distance according to an arrangement gap of the object to be bonded to adjust a distance between the plurality of semiconductor chips disposed in the tray.

16. The assembly in accordance with claim 11, further comprising a tray vacuum suction module disposed below the tray, the tray vacuum suction module sucking in the semiconductor chip pushed downward to dispose the semiconductor chip in the chip guide of the tray.

17. The assembly in accordance with claim 11, wherein the pick module comprises:
- a vacuum suction module for picking up each of the plurality of semiconductor chips disposed in the tray by a vacuum suction;
- an up/down conveying means having the vacuum suction module mounted therein, the conveying means conveying the vacuum suction module upward and downward; and
- a vertical conveying means for conveying the up/down conveying means in a vertical direction.

* * * * *